United States Patent [19]
Goto

[11] Patent Number: 5,589,788
[45] Date of Patent: Dec. 31, 1996

[54] TIMING ADJUSTMENT CIRCUIT

[75] Inventor: Masaharu Goto, Hannou, Japan

[73] Assignee: Hewlett-Packard Company, Palo Alto, Calif.

[21] Appl. No.: 435,877

[22] Filed: May 5, 1995

[30] Foreign Application Priority Data

May 12, 1994 [JP] Japan .................................. 6-124173

[51] Int. Cl.⁶ ................................................ H03K 5/135
[52] U.S. Cl. .......................... 327/276; 327/277; 327/294; 327/299
[58] Field of Search .................................... 327/261–263, 327/269–271, 276, 277, 284, 392, 393, 395, 400, 231, 237, 242

[56] References Cited

U.S. PATENT DOCUMENTS

| | | | |
|---|---|---|---|
| 4,620,180 | 10/1986 | Carlton .................................... | 327/284 |
| 4,675,612 | 6/1987 | Adams et al. ........................... | 327/152 |
| 4,713,621 | 12/1987 | Nakamura et al. ..................... | 327/152 |
| 4,796,095 | 1/1989 | Shimada .................................. | 327/99 |
| 4,802,194 | 1/1989 | Nishibe .................................... | 327/267 |
| 4,859,954 | 8/1989 | Yoshimura .............................. | 327/277 |
| 5,033,066 | 7/1991 | DeVore .................................... | 327/265 |
| 5,355,037 | 10/1994 | Andresen et al. ...................... | 327/277 |
| 5,376,849 | 12/1994 | Dickol et al. ............................ | 327/276 |
| 5,382,850 | 1/1995 | Aldrich et al. .......................... | 327/277 |

OTHER PUBLICATIONS

Bt 604 EVM data sheet, 1990, 16pg., Brooktree Corporation.

Bt 624 EVM data sheet, 1990, 11pg., Brooktree Corporation.

*Primary Examiner*—Timothy P. Callahan
*Assistant Examiner*—T. Lam

[57] ABSTRACT

A timing adjustment circuit consists of a delay circuit made from n delay elements (n is an integer of 2 or more) connected in series, with which an input signal p0 is delayed in succession by each delay element, in order to generate respective delay-signals p1, . . . , pn, and a selection circuit with which any one of input signals p0 and aforementioned respective delay signals p1, . . . , pn are selected by n+1 number of selection signals s0, . . . , sn. The selection circuit comprises a selection-signal generation circuit, a selection gate circuit, a selection-signal holding circuit and a delay-signal holding circuit. The selection-signal generation circuit generates selection signals s0, . . . , sn before input signal p0 is input. The selection-signal holding circuit holds selection-signals s0, . . . , sn from the selection-signal generation circuit until the active edge of p0, . . . , pn reaches each selection gate. The delay-signal holding circuit comprises n delay-signal holding elements. When the active edge has arrived at each of the selection gates, each is held in an output state until the input to the selection gates becomes inactive, even if the selection signals changes.

6 Claims, 10 Drawing Sheets

TIMING ADJUSTMENT CIRCUIT

FIELD OF THE INVENTION

This invention relates to a timing adjustment circuit used as, for instance, a timing vernier of a timing edge generation circuit for IC testers. In further detail, it relates to a timing adjustment circuit which enables generation of a timing edge that is not limited to the period of a master clock that it is based on.

BACKGROUND OF THE ART

Tests on a variety of devices, e.g. with an IC tester, and tests of electronic circuits with waveform generators, often require generation of a timing edge that is not limited to the period of a clock which becomes a basis of the system (i.e., a master clock (MCLK)). FIG. 5 shows a conventional timing edge generation circuit used in IC testers. The MCLK feeds a constant high frequency (for instance, 100 MHz to 500 MHz) to the timing edge generator. The period clock (PCLK) determines a test cycle and is preferably a certain multiple of the master-clock period.

The circuit of FIG. 5 includes a memory (time data RAM 1), a counter 2, a fine timing indication circuit (FIFO 3), a timing adjustment circuit (time vernier 4) and flip-flops 5, 6, and 7. The timing data (timing_data) includes counter data (counter_data) and vernier data (vernier_data_in) is stored in a time data RAM 1. The time data RAM 1 outputs predefined timing_data each time an active edge of the PCLK is input to its strobe terminal.

The counter 2 receives counter_data from the time data RAM 1 and includes a start selector 21, count circuits 221 through 224, and an OR gate 23. The start selector 21 selects sequentially count circuits 221–224 in response to "start" signal from FF 6 (one MCLK delayed signal from an output of FF 5). Count circuits 221–224 will count a number of cycles of the MCLK which is indicated by the counter_data, when they receive a signal for starting to count from start selector 21, and then will provide digital delay signals DD_m1 through the OR gate 23 at a timing corresponding to the count value. Digital delay signals DD_m1 are digitally delayed "start" signal in accordance with the value of counter_data_in by counter 2.

"Fifo_in" signals synchronized with MCLK are provided from FF 5 to an input indication terminal "in" of FIFO 3. FIFO 3 receives vernier_data_in upon a rising edge of fifo_in. In turn, vernier_data, which are stored in FIFO 3, are sequentially input to the time vernier 4 in a timing of an output edge of DD_m1 from the counter 2 (output edge from respective count circuits 221–224). FF 7 provides DD_m1 to the time vernier 4 as digital delay signals DD which is synchronized with MCLK. Time vernier 4 then delays DD in accordance with a content of vernier_data and outputs fine edge signals FE.

FIGS. 6 through 8 illustrate a circuit of time vernier 4. In FIG. 6, a time vernier 4 is comprised of a digital-analog converter (DAC) 401, a ramp signal generation circuit 402, and a comparator 403. DAC 401 receives vernier_data and converts it to an analog reference voltage ($V_{dac}$). The ramp signal generation circuit 402 includes a switch ($SW_r$), in which one of its terminals is grounded, and which will turn off in response to a rising edge of digital delay signals DD, a capacitor ($C_r$) for ramp voltage generation and a current source ($I_r$) which will charge $C_r$ when switch $SW_r$ is opened. The comparator 403 compares the charge voltage of $C_r$ (ramp voltage $V_{ramp}$) and $V_{dac}$, and outputs its result which will be referred as fine edge signals FE.

Charging of $C_r$ begins when $SW_r$ is opened by an edge input of the digital delay signals DD. When the charge voltage $V_{ramp}$ of $C_r$ is less than $V_{dac}$, the output of FE is "0". When $V_{ramp}$ exceeds $V_{dac}$, FE becomes "1". That is, the comparator 403 will output FE when the time corresponding to a value of $V_{dac}$ has elapsed.

A time vernier 4 in FIG. 7 comprises CMOS circuits 411 and 412, and a group of capacitors which is digitally adjustable of its capacity (shown as a variable capacitor $C_v$). PCTRL is input to P-MOST$_1$ and P-MOST$_2$ gate terminals of both CMOS circuits. Digital delay signals DD are input to an input terminal (a gate terminal of N-MOST$_1$) of CMOS circuit 411. One end of $C_v$ is connected to a low voltage power source, while the other end is connected between terminals of respective P-MOST and N-MOST of both CMOS circuits 411 and 412.

In the circuit shown in FIG. 7, when an edge is input to N-MOST$_1$ gate, fine edge signals FE are output at an output which terminal of CMOS circuit 412 after a specific time, depends on the capacity of $C_v$, being elapsed. However, there is a problem with timing adjustment circuits (time vernier 4) shown in FIGS. 6 and 7 in that both a sufficient timing adjustment range and a good resolution cannot be simultaneously accomplished, when either of these circuits is used exclusively.

A time vernier shown in FIG. 8 comprises fine delay means 420, coarse delay elements 421 through 427, calibrating registers for a calibration of these coarse delay elements (indicated by 428), and a multiplexer (MUX) 429 which selectively outputs signals p0 from fine delay means 420 and signals p1 through p7 that have been coarsely delayed by coarse delay elements 421–427. Data (vernier_data_5), which is comprising (e.g. the least significant 5 bits) of total bits (8 bits in this figure) of vernier_data, is input to the fine delay element 420, while data (vernier_data_3), including remaining bits (the most significant 3 bits in the figure) is input to the multiplexer 429. When the digital delay signals DD has been finely delayed in accordance with the value of aforementioned vernier_data_5 by fine delay means 420, it is coarsely delayed in sequence by coarse delay elements 421–427. The multiplexer 429 selects one signal from p0 through p7 in accordance with the value of vernier_data_3 and outputs this as fine edge signals FE.

Assuming that the amount of a delay time by each coarse delay means 421–427 is $\tau_d$, when the delay time amount of fine delay element 420 is less than $\tau_d$, there will be an amount in which such delay time cannot be set. Therefore, a delay time amount that is equal or greater than $\tau_d$ is generally used for fine delay means 420.

The operation of the timing edge generation circuit in FIG. 5, which uses the circuit of FIG. 8 as timer vernier 4, will now be explained. The PCLK is provided to a timing edge generation circuit during a period that is two times of the period T of MCLK. As previously mentioned, when the rising edge of the PCLK is input to the strobe terminal of time data RAM 1, time data RAM 1 outputs timing_data. Then, vernier_data_in (8 bits in the example in FIG. 5) are output to FIFO 3, and counter_data (8 bits in the example in FIG. 5) are output to counter 2. Now, the PCLK is continuously input over 3 clocks to the aforementioned timing edge generation circuit and following data are output in sequence from the time data RAM 1 (the numbers in parentheses indicate an output sequence from the time data RAM 1).

timing_data(1)
    counter_data(1):00000001
    vernier_data(1):01111110
timing_data(2)
    counter_data(2):00000010
    vernier_data(2):10111110
timing_data(3)
    counter_data(3):00000011
    vernier_data(3):11011100

In this case, when "start" signals are input, count circuits 221–224 in FIG. 5 output digital delay signals DD_m1 after counting a specific number of MCLK, which corresponds to the value of respective counter_data (as shown in FIG. 9). In FIG. 9, the number of MCLK to be counted during from the rising of "start" signals until an input of DD_m1 are shown by reference numbers in circles.

As explained with FIG. 8, after digital delay signals DD are finely delayed by the fine delay circuit 420 (in accordance with vernier_data_5), it will be coarsely delayed by coarse delay circuits 421–427. Multiplexer 429 in turn selects any of the aforementioned signals p0 through p7 and outputs these selected signals as fine edge signals FE in accordance with vernier_data_3. In the example shown in FIG. 9, vernier_data_3 is 011, 101 and 110, and signals p3, p5 and p6 are sequentially selected and output FE. A correct FE is obtained since DD signals are separated by 2 MCLK periods in time sequence. However, if DD signals are separated by less than 2 MCLK periods, following problems occurred.

When DD signals are propagated while it is delayed by delay elements 421–427, time vernier 4, which originally must operate in accordance with vernier data (n) (n is an integer), will operate in accordance with new vernier_data(n+1) when next DD_m1 is newly input to an output terminal of FIFO 3. Therefore, (i) glitches accompanying a change of the vernier_data may be appeared, and (ii) when an edge is output from an delay element, previous vernier_data(n) is renewed with new vernier_data(n +1) and therefore, delay element can not provide the output to be originally selected.

FIG. 10 shows a timing chart when PCLK is continuously input over 4 clocks to the aforementioned timing edge generation circuit, and vernier_data with counter_data of 00000000 is output as shown below from time data RAM 1.

timing_data(1)
    counter_data(1):00000000
    vernier_data(1):01111110
timing_data(2)
    counter_data(2):00000000
    vernier_data(2):10111110
timing_data(3)
    counter_data(3):00000000
    vernier_data(3):11011100
timing_data(4)
    counter_data(4):00000000
    vernier_data(4):00000000

FIG. 10 illustrates cases where glitches are appeared in fine edge signals FE ($A_1$, $A_2$) and where there is no output ($A_3$).

ems, conventionally the method is also known whereby, as shown in FIG. 11, by using several vernier circuits (4a through 4d) digital delay signals DD, which is continuously input, is delayed in sequence by vernier circuits 4a–4d and output through OR gate 430. However, the cost of the timing edge generation circuit or an apparatus including such generation circuit becomes high since an delay element is expensive and also following problems tend to occur.

Even if finely adjusted, the timing generated by four different vernier circuits 4a–4d may be offset to the extent of 10 to 50 ps (position of the edges from vernier circuits 4a–4d may fluctuate by, for instance, 10 to 50 ps). Consequently, the edge timing of fine edge signals FE includes an error component that is periodically fluctuated, in which this period may be four period of DD. By monitoring fine edge signals FE by a spectrum analyzer, in addition to a basic wavelength (basic wave of a waveform where its period is four periods of DD), ½ and ¼ frequency components can be detected.

When this type of fine edge signal FE is used as a conversion clock for a digital-analog converter or an analog-digital converter, such fluctuation in timing may be converted to an error in amplitude, and the measurement result therefore includes a periodic error (error during a period of four periods of DD may be appeared). For example, in a spectrum analyzer timing edge generation circuit such as shown in FIG. 11 is used, a periodic error may be appeared as an excess spectrum, an accuracy of the measurement may be deteriorated.

SUMMARY OF THE INVENTION

This invention is presented in order to solve the aforementioned problems. The object of this invention is to provide a timing adjustment circuit which, even an input signal is continuously generated at close interval, allows an accurate timing edge to be obtained without glitches, and markedly reduces cost when compared to conventional circuits having the same types of properties. Further, object of this invention is to provide a timing edge generation circuit in which the aforementioned timing adjustment circuit may be used as timing vernier.

According to one aspect of the present invention, a timing adjustment circuit for receiving an input signal p0 and comprising: delay means including n serially connected delay elements (n being an integer of two or more) and outputting n+1 signals to be selected, the first one of said n+1 signals to be selected being said input signal p0 delayed in sequence by each serially connected delay element to generate the rest of said signals to be selected p1, . . . , pn; a selection signal generation circuit for generating n+1 selection signals s0, . . . , sn before said input signal p0 is input; a delay signal holding circuit; a selection gate circuit connected to said delay means and further connected, via said delay signal holding circuit, to said selection signal generation circuit and comprising n+1 selection gates, wherein pairs of associated ones of said signals to be selected and said selection signals p0 and s0, p1 and s1, . . . , pn and sn are applied as inputs to respective selection gates and one of said signals to be selected p0, . . . , pn from a selected selection gate is output; and, said delay signal holding circuit comprising n delay signal holding elements further connected to said delay means and responsive to said signals to be selected p0, p1, . . . , pn for holding output states to said n selection gates in accordance with said selection signals s0, . . . , sn until the inputs to said selection gate circuit become inactive.

According to another aspect of the present invention, the timing adjustment circuit as recited in the aforementioned first aspect wherein said selection gate circuit further connected via a selection signal holding circuit from said selection signal generation circuit, said selection signal holding circuit holding at least some of said selection signals s0, . . . , sn from said signal generation circuit until active edges associated of said signals to be selected p0, ..., pn reache said selection gates;

According to another aspect of the present invention, the timing adjustment circuit as recited in the aforementioned first aspect wherein said selection signal generation circuit comprises a decoder for decoding a series of input data bits.

According to another aspect of the present invention, the timing adjustment circuit as recited in the aforementioned first aspect wherein said delay signal holding circuit is comprised of a latch which cancels its memory state when said signals to be selected to said selection gate circuit or a respectively applied delay signal becomes inactive.

According to another aspect of the present invention, the timing adjustment circuit as recited in the aforementioned first aspect wherein said selection signal holding circuit comprises a flip-flop to which is applied a selection signal which also selects delay signals from at least specific ones of said delay elements, said flip-flop being triggered by one of said signals tobe selected.

According to another aspect of the present invention, the timing adjustment circuit as recited in the aforementioned first aspect wherein said delay means further comprises fine delay means for which performing a fine delay of an input signal thereto, said fine delay being equal to or less than a delay time of each said delay elements, said fine delay means connected as an input to said serially connected delay elements.

According to another aspect of the present invention, the timing adjustment circuit as recited in the aforementioned first aspect wherein said delay means further comprises fine delay means for which performing a fine delay of an input signal thereto, said fine delay being equal to or less than a delay time of each said delay elements, said fine delay means connected as an output to said selection gate circuit.

According to another aspect of the present invention, a timing edge generation circuit comprising: memory means for storing counter delay data and vernier delay data; counter means receiving said counter delay signal from said memory means for delaying and outputting a period clock by counting a master clock up to said counter delay data, said period clock being obtained by dividing a master clock by a predetermined number; vernier indication circuit for temporarily storing and then outputting said vernier delay data received from said memory means; and, said timing edge generation circuit further comprising said timing adjustment circuit as set forth in claim 1 for delaying and then outputting the output of said counter means in accordance with the output of said vernier indication circuit.

DETAILED DESCRIPTION OF THE INVENTION

The effects of the invention will now be explained with actual examples. In the examples given here, a signal (for instance, digital delay signals when these examples are used as a timing vernier) with a time interval of $(1+m)T$ (m is a positive integer that may vary with each input signal) of period T of a clock of a certain period (i.e., a master clock), are successively input into a timing adjustment circuit. Moreover, a timing adjustment circuit includes delay means (coarse delay means) having a plurality of delay elements (coarse delay elements) that are connected in series, and another delay means (fine delay means) that produces a fine delay.

By means of this invention, fine delay means receives delay data before input signals are input. Such delay data are referred as "fine delay data". That is, a delay time for the delay means has already been established by fine delay data when signals of $(1+m)T$ period are input to the fine delay means. Moreover, a selection signal generation circuit similarly receives other delay data before the input signals are input. Such delay data are referred as "coarse delay data".

Input signals are finely delayed based on fine delay data. This delay time is set at, for instance, a range of 0 to $T/2^B$. (B is a number of bits of the coarse data and $T/2^B$ is a delay time for one coarse delay element.) The input signals that have been finely delayed by the fine delay means provided to the coarse delay means. Then, the input signals are coarsely delayed in sequence by a plurality of coarse delay elements connected in series. This delay time is $T/2^B$ for one coarse delay element, as previously mentioned. Consequently, the input signals are delayed for $T/2^B$ when they are propagated through the coarse delay elements.

On the other hand, the selection means receives coarse delay data (in this example, B bits) in series prior to an input of input signals and based on said data, selects delay signals from one of the coarse delay elements.

The selection means includes a selection signal holding circuit and a delay signal holding circuit. The selection-signal holding circuit retains each selection signal from the selection signal generation circuit until an active edge of the input signals, which are propagated through each of the aforementioned coarse delay elements in series, reach each selection gate.

Although coarse delay data are renewed before the input signals are input to the fine delay means or coarse delay means, there are also cases where such renewal of the coarse delay data for the next input signals is performed before an edge of certain input signals has passed through certain coarse delay elements if a cycle of the input signals is short.

Figure 8:
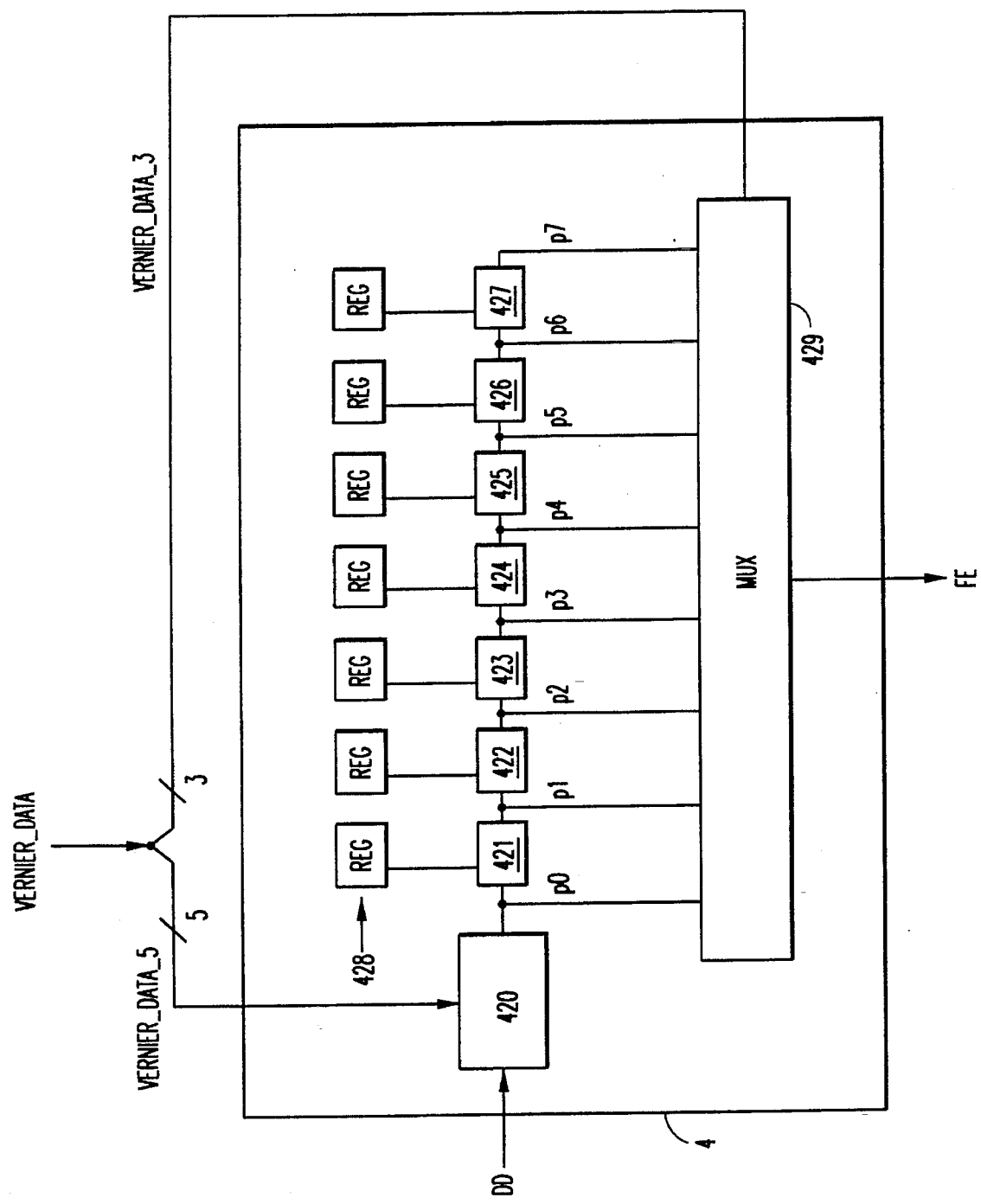
FIG. 8 is illustrates another actual circuit of a conventional time vernier.
Figure 9:
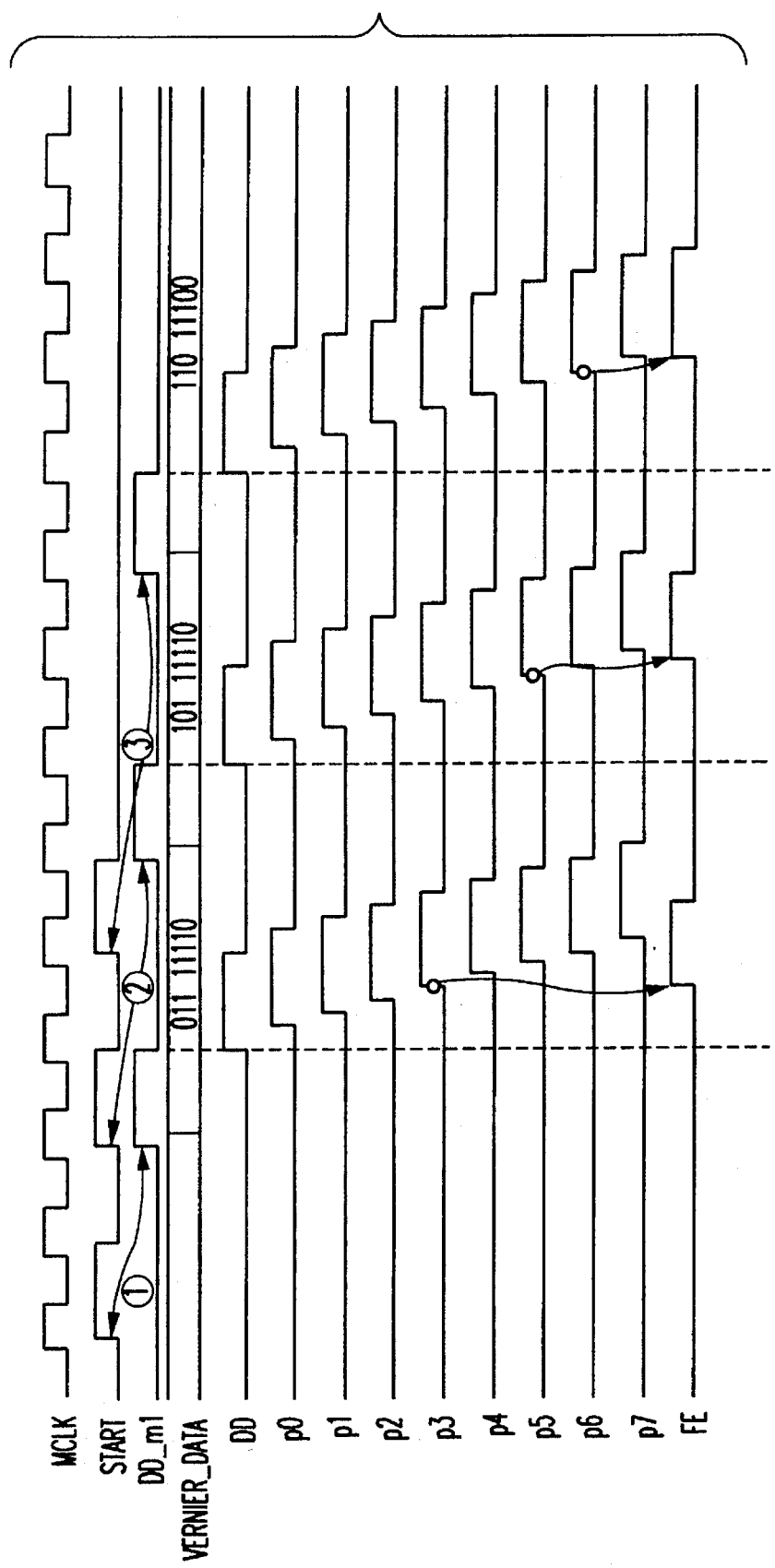
FIG. 9 is a timing chart showing operation of timing edge generation circuit in FIG. 5 in which conventional time vernier in FIG. 8 is used.
Figure 10:
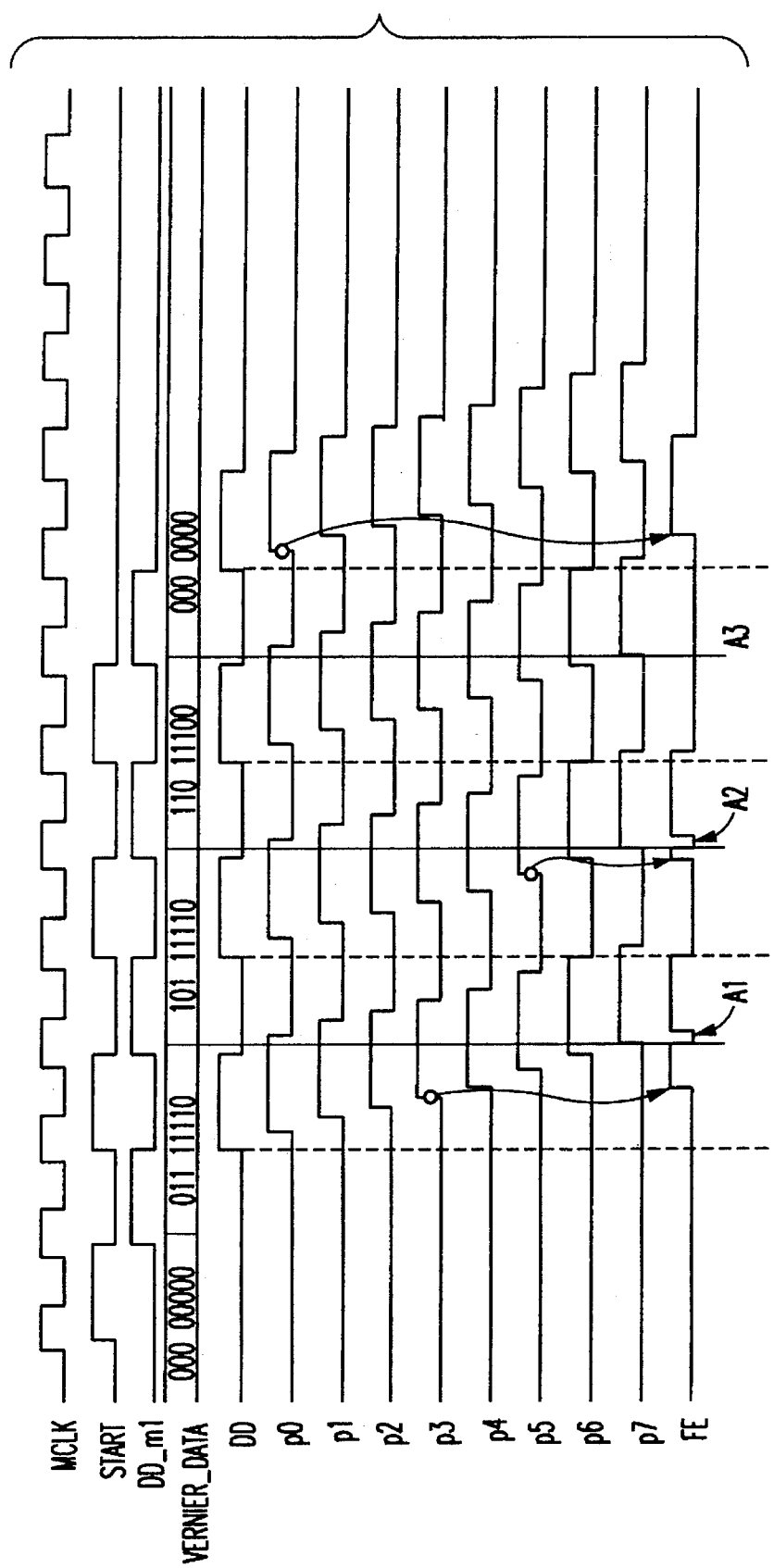
FIG. 10 is a timing chart showing the operation of timing edge generation circuit in FIG. 5 in which conventional time vernier in FIG. 8 is used.
Figure 11:
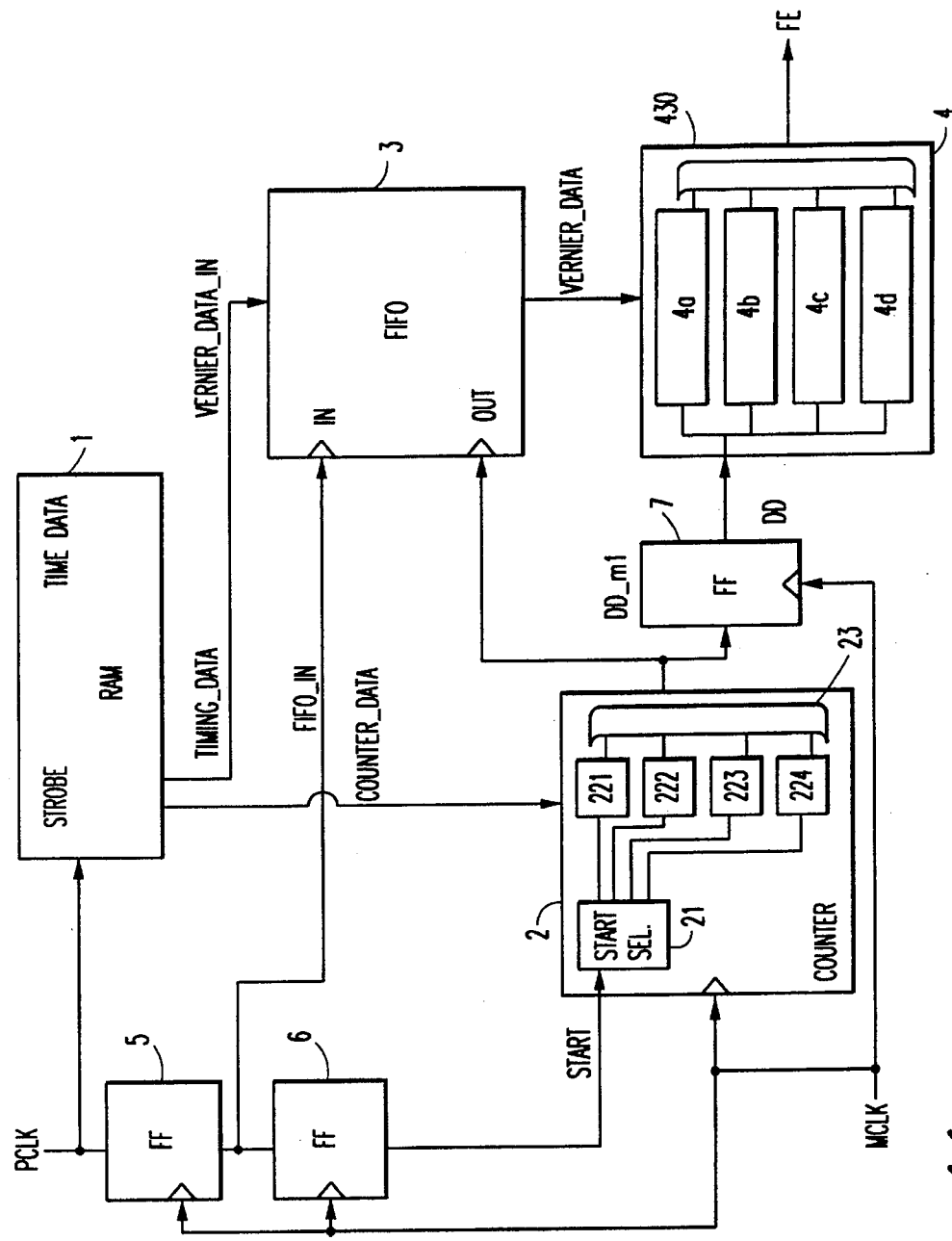
FIG. 11 shows a conventional time vernier using a plurality of vernier circuits.

In accordance with the conventional timing adjustment circuit in FIG. 8, delay signals are selected based on the renewed delay data, as shown in FIG. 10. In some cases, delay signals that should not be selected may be chosen and thus an accurate timing edge cannot be accomplished, or the delay signals that should be output are not output (that is, are "thinned" out).

These types of inconveniences may also occur with this invention due to a period of the input signals and the output timing of the selection signals. However, by means of the timing adjustment circuit of this invention, the selection state based on selection data prior to a renewal is retained by the selection signal holding circuit, even if the coarse delay data are renewed as previously mentioned, and therefore, a possibility of occurring a thinning out of delay signals becomes substantially very low. Especially such thinning will never occur when time data do not decrease in sequence. Moreover, the delay signal holding circuit holds an output state of each selection gate until an input to the selection gates becomes inactive, when an active edge has been provided to each selection gate, and even if the aforementioned selection signals vary.

By means of the conventional timing adjustment circuit of FIG. 8, when the coarse delay data are renewed before data has become inactive and after the active edge is output, the output of said delay signals is stopped and the output immediately changes to an output based on a selection by coarse delay data, as shown in FIG. 10. Therefore, a glitch may occur.

However, in accordance with the timing adjustment circuit of this invention, an output state of each selection gate is retained until an input to the selection gates becomes inactive, even if the aforementioned selection signals change, and therefore, there is no possibility of occurring glitches.

Furthermore, by retaining an output state until an output of the next coarse delay element becomes inactive, the output state can be held until after the delay signals become inactive. In such case, retention of the aforementioned output state can be guaranteed, even at the last element of the coarse delay elements, by adding similar delay element as the aforementioned coarse delay element to the last element of the coarse delay elements.

In more concrete terms, the signal generation circuit is comprised of a decoder that decodes input selection data. Each selection gate may be a logic gate that outputs a logical product of both input signals. The selection signal holding circuit may be a flip-flop where the selection signal for selecting delay signals from at least specific delay elements is input and is driven by the output of the delay element of the step prior to the input signals of the specific step. The delay signal holding circuit may be a latch which releases when an input signal or respective delay signal becomes inactive.

Figure 1:
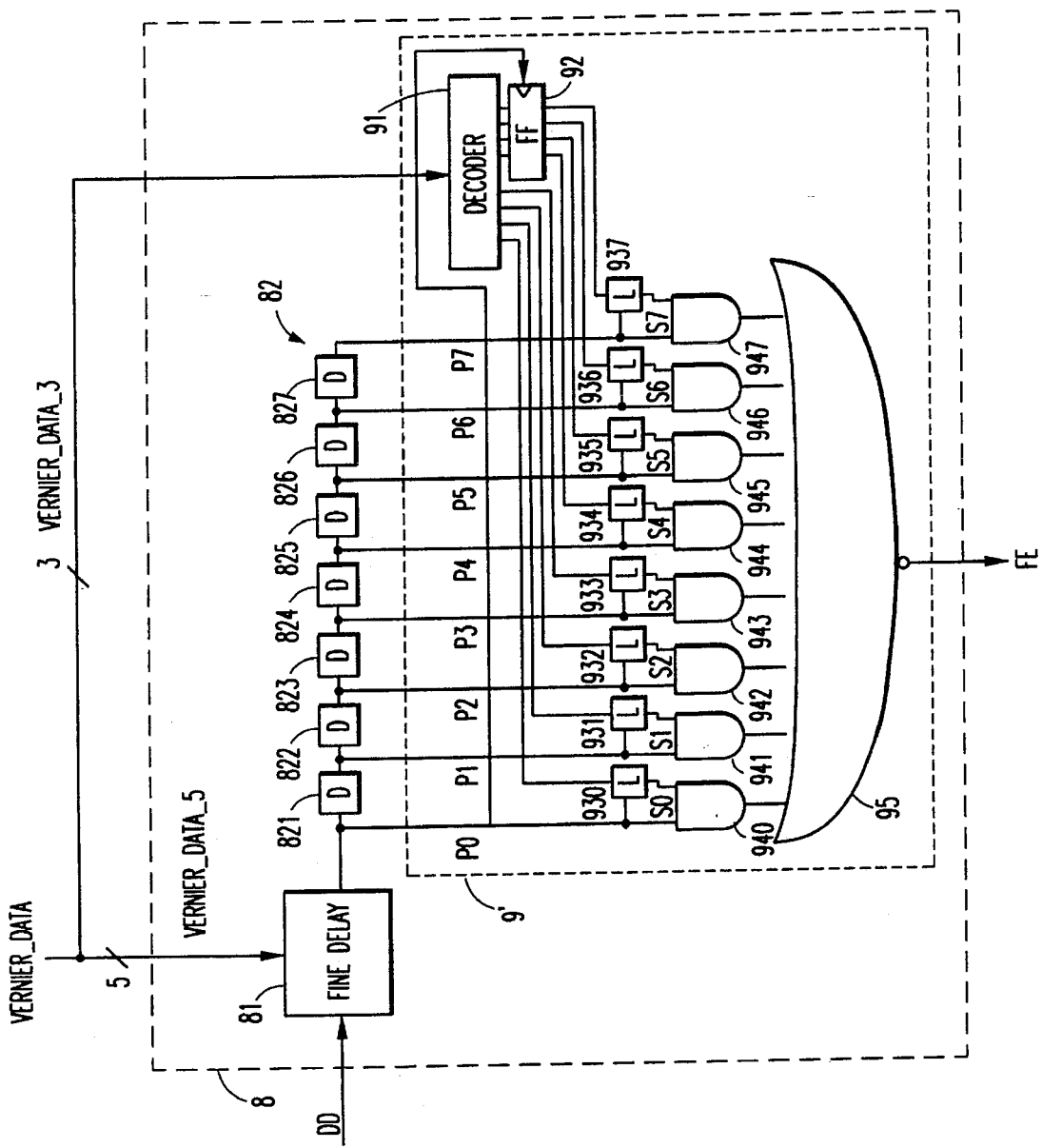
FIG. 1 shows an embodiment of timing adjustment circuit of this invention.

FIG. 1 shows one embodiment of the timing adjustment circuit of this invention. Timing adjustment circuit 8 comprises fine delay means 81, coarse delay means 82 and selection means 9'. Fine delay means 81 is set up at the input step of timing adjustment circuit 8 and finely delays input signals corresponding to the least significant 5 bits (vernier_data_5) of 8 bits of vernier_data. Coarse delay means 82 follows fine delay means 81.

Output p0 of fine delay means 81 and respective output p1 through p7 of each coarse delay element 821 through 827 are provided to selection means 9'. Selection means 9' comprises a selection signal generation circuit (decoder 91), a selection gate (AND gates 940–947 and OR gate 95), a selection signal holding circuit (FF 92) and a delay-signal holding circuit (latches 930–937).

Decoder 91 outputs detection signals s0 through s7 based on the most significant 3 bits (vernier_data_3) of the vernier_data. FF 92 may be provided to store temporarily a portion of selection signals (e.g. last four selection signals s4–s7 of the decoder in this embodiment) for selecting delay signals from coarse delay elements 824 through 827, and outputs these stored signals s4 through s7 upon the rising edge of output p0 of fine delay means 91 to latches 934 through 937. It is apparent to those skilled in the art that a number of selection signals, which should be held during the next period in output p0, depends on the delay width of each coarse delay elements. Latches 930 through 937 operate on the rising edge. By making inactive output p0 of fine delay means 81 and outputs p1 through p7 of coarse delay elements 821 through 827 (or depending on the case, converting these to level L) and by using outputs s0 through s3 of first through fourth lines of decoder 91 and four outputs s4 through s7 of FF 92 as inputs, the level of respective s0 through s7 are output at this time.

Output p0 of fine delay means 81 and outputs p1 through p7 of coarse delay elements 821 through 827 are input to an input terminal of AND gates 940 through 947 respectively, while outputs of latches 930 through 937 are input to the other input terminal of AND gates 940–947.

Figure 2:
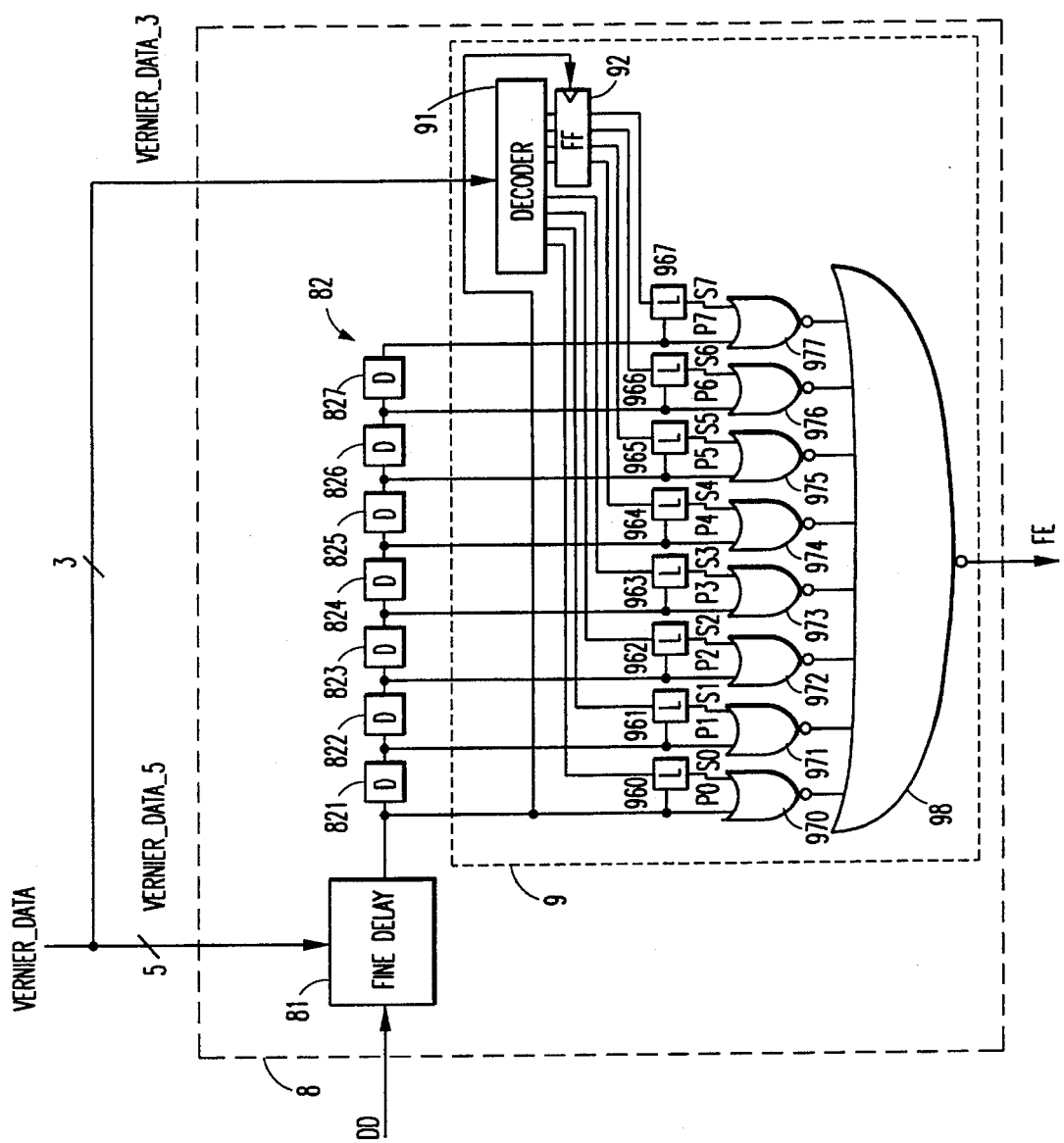
FIG. 2 shows a negative logic operation circuit that is equivalent to the timing adjustment circuit in FIG. 1.

FIG. 2 shows a negative logic operation circuit that is equivalent to the timing adjustment circuit in FIG. 1. In FIG. 2, level L of input signals DD is active and a falling edge of output p0 from fine delay means 81 becomes an active edge which triggers FF 92. Furthermore, although fine delay means 81, coarse delay means 82, decoder 91 and FF 92 are the same as in FIG. 1, since the circuit in FIG. 2 is operated by negative logic, latches 960 through 967 operate on the falling edge. By making output p0 of fine delay means 81 and outputs p1 through p7 of coarse delay elements 821 through 827 inactive (in this case, by converting them to level H), the s0 through s7 level is output at this time.

Although the selection gates in FIG. 2 comprise NOR gates 970 through 977 and NOR gate 98, and where the output of the aforementioned gates serve as an input, the operation is essentially the same as with the selection gates in FIG. 1.

Figure 3:
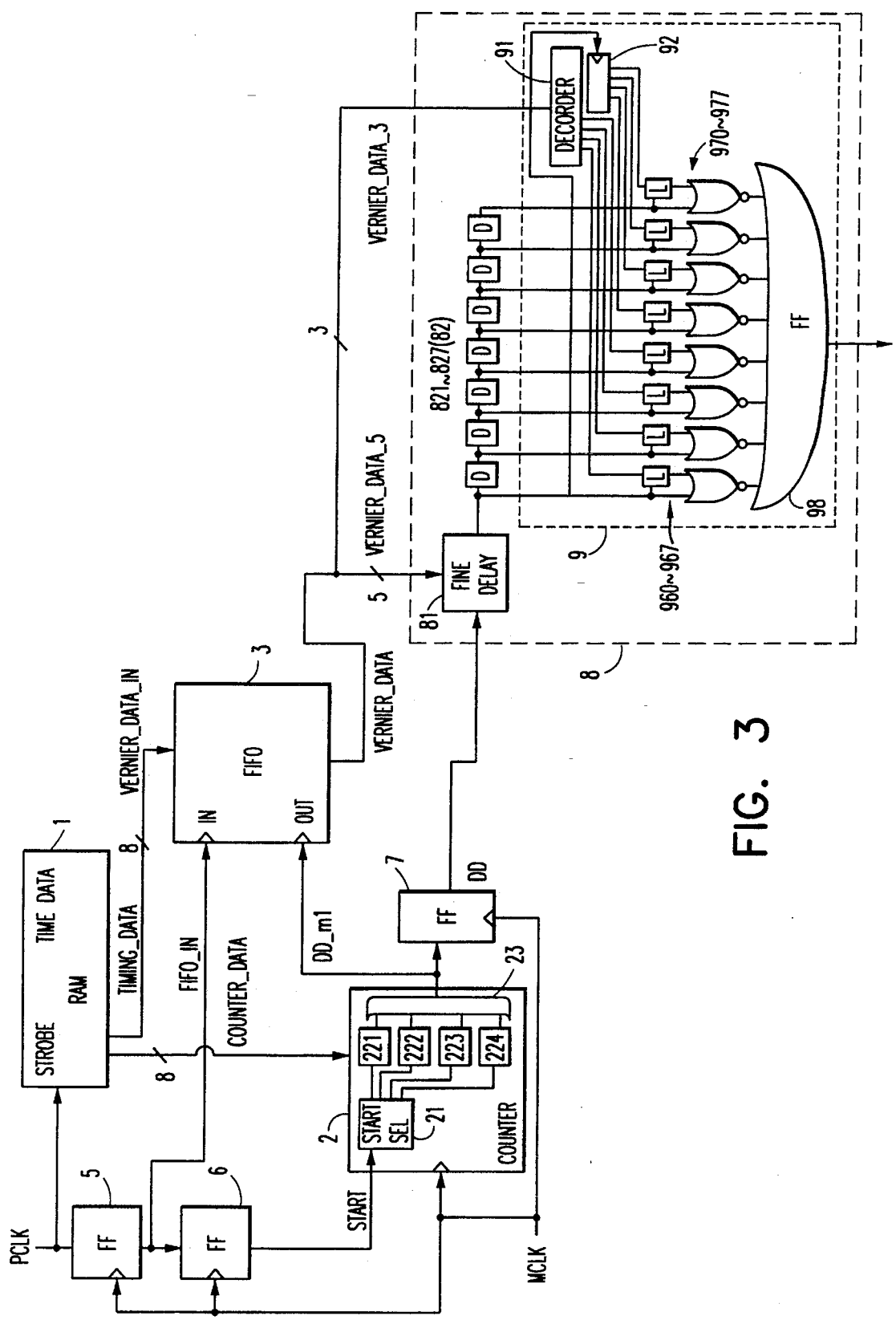
FIG. 3 shows a timing edge generation circuit in which timing adjustment circuit in FIG. 2 is used as a timing vernier.
Figure 5:
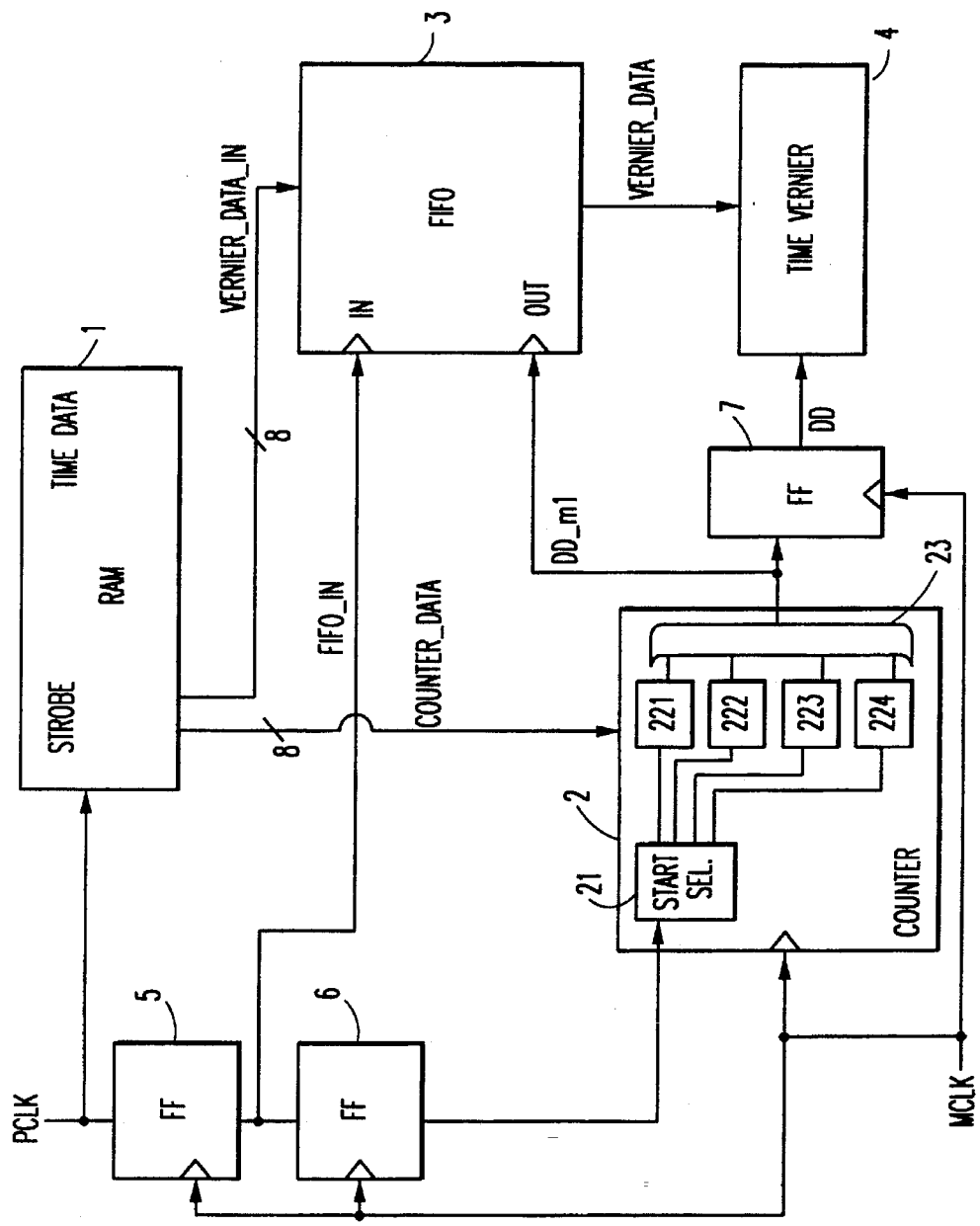
FIG. 5 illustrates a conventional timing edge generation circuit.
Figure 6:
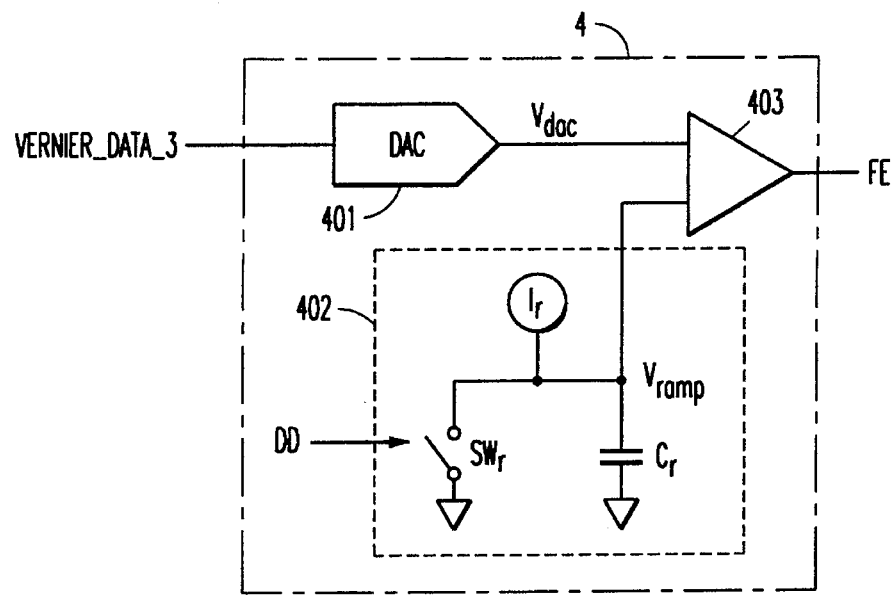
FIG. 6 illustrates an actual circuit of a conventional time vernier.
Figure 7:
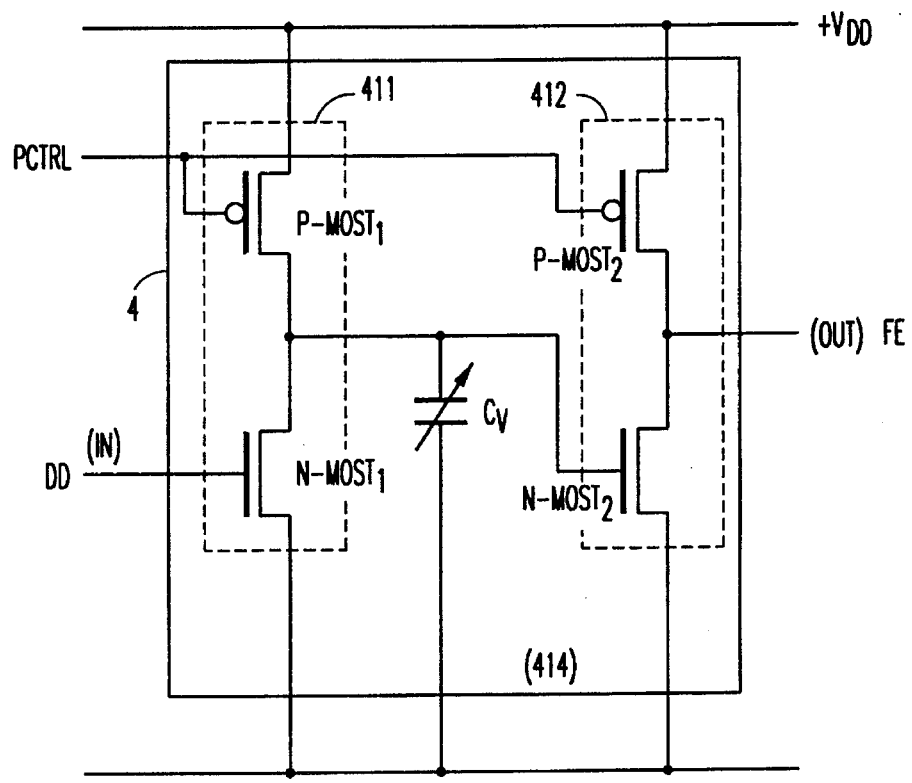
FIG. 7 illustrates another actual circuit of a conventional time vernier.

FIG. 3 shows a timing edge generation circuit that uses timing adjustment circuit 8 of FIG. 2 as a timing vernier. This circuit utilizes the timing adjustment circuit in FIG. 1 as a timing vernier of the circuit shown in FIG. 5. Other than the timing vernier, this embodiment differs from FIG. 1 on only FF 7 being an output of negative logic.

For example, the timing-edge generation circuit is operated by 4 consecutive PCLK and the same data as in FIG. 10 is output in series from time data RAM 1. The case will be explained (with reference to FIG. 4) where the PCLK is continuously input as 4 clocks to the aforementioned timing-edge generation circuit. The following data (the numbers in parentheses show an output sequence from time data RAM 1) is sequencially output from the time data RAM 1.

timing_data(1)
   counter_data(1):00000000
   vernier_data(1):01111110
timing_data(2)
   counter_data(2):00000000
   vernier_data(2):10111110
timing_data(3)
   counter_data(3):00000000
   vernier_data(3):11011100
timing_data(4)
   counter_data(4):00000000 vernier_data(4):00000000

In FIG. 3, the PCLK is input to time data RAM 1 and FF 5, and time data RAM 1 outputs timing_data(1) through timing_data(4) in series. Then, FF 5 outputs signals synchronized with the MCLK to FIFO 3 and FF 6. FF 6 outputs the "start" signals (signals delayed by 1 MCLK from the output of FF 5) to start selector 21 provided within counter 2 (please refer to "MCLK" and "start" in FIG. 4.).

Start selector 21 selects counter circuits 221 through 224 in series and counts the MCLK, which is in accordance with counter_data(1) through counter_data(4). It then outputs digital delay signals DD_m1 through OR gate 23. Here, counter_data(1) through counter_data(4) are all 00000000.

Vernier_data (shown by vernier_data_in in FIG. 1) from time data RAM 1 is input to FIFO 3 in accordance with the output of FF 5 (fifo_in). In turn, FIFO 3 outputs vernier_data(1) through vernier_data(4) from 8 bits of data to the timing adjustment circuit (that is, time vernier 4) using the rising edge of DD_m1.

When DD_m1 are input to FIFO 3, FIFO 3 outputs vernier_data to decoder 91. As a result, when vernier_data_3 of decoder 91 changes from 000 to 011 ((a) in FIG. 4). s0 becomes inactive (level H) ((b) in FIG. 4), and s3 becomes active ((c) in FIG. 4). p0, which has been finely delayed by fine delay means 81, is further delayed coarsely by coarse delay elements 821 through 823 to become p3.

When the active edge of p3 is input to a control terminal of latch 963, s3 is latched by latch 963. Since s3 is in an active level (level L), NOR gate 973 changes from level L to level H (please refer to (d) in FIG. 4). The decimal number expressions of vernier_data(1) through vernier_data(4) are 126, 190, 220, and 0, respectively.

Next, although vernier_data_3 changes from 011 to 101 before p3 becomes inactive (level H), s3 is latched by latch 962 and therefore s3 does not becomes inactive (level H) when vernier_data_3 changes. When p3 becomes inactive, the latch of latch 963 is deactivated and therefore, s3 becomes inactive (that is, rises) and changes to level H ((e) in FIG. 4).

As previously explained, at this time vernier_data_3 has already changed from 011 to 101, but when vernier_data_3 does become 101 (that is, p5 is selected), selection signal s5 is temporarily stored in FF 92. Here, when the active edge of the second DD is input and p0 falls, FF 92 renews this output ((f) in FIG. 4) and s5 becomes active (Level L) ((g) in FIG. 4). s5 is latched by latch 965 and the output of NOR gate 975 rises ((h) in FIG. 4). As a result, p5 becomes inactive and output of NOR gate 975 falls while the latch s5 is deactivated ((i) in FIG. 4).

Figure 4:
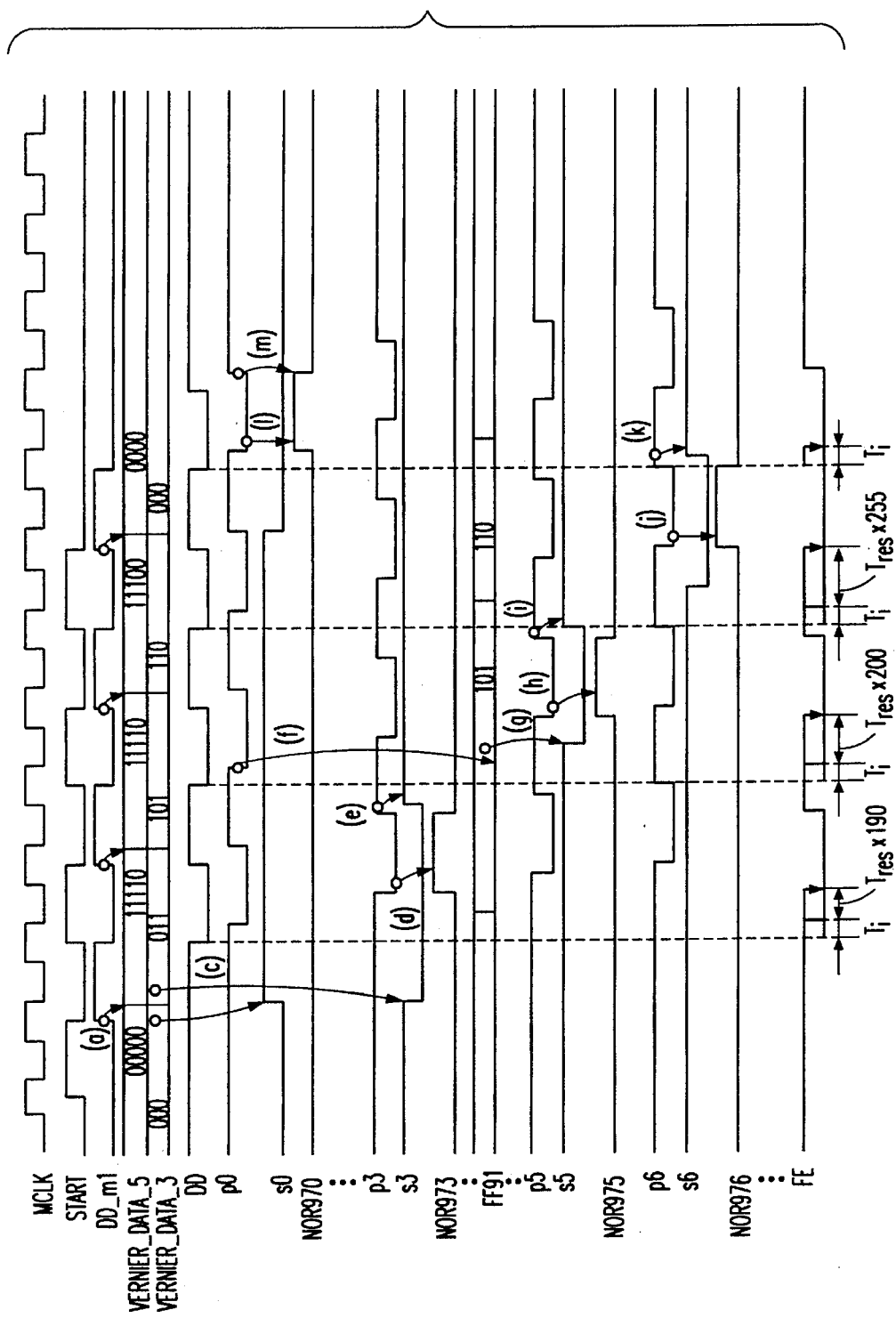
FIG. 4 is a timing chart showing the operation of each part of timing edge generation circuit in FIG. 3.

The output of NOR gate 976 rises and falls responsive to an input of the active edge of the third DD ((j) and (k) in FIG. 4). In turn, the output of NOR gate 970 rises and falls with the input of the active edge of the fourth DD ((l) and (m) in FIG. 4).

Thus, fine edge FE is output after $(T_i+T_{res}\times190)$, $(T_i+T_{res}\times220)$, $(T_i+T_{res}\times255)$, and $T_i$ elapsed from active edges of the first through fourth DD, respectively. Here, $T_i$ is an internal delay time and $T_{res}$ is a time vernier resolution.

Various modifications to the present invention will become apparent to those skilled in the art from the foregoing description and accompanying drawings. For example, in FIG. 1, fine delay means 81 can be located at the end of selection means 9' by connecting DD to coarse delay element 821, connecting fine delay means 81 to FE, connecting vernier_data_5 to an additional flip-flop, connecting the flip-flop to an additional latch, and connecting the latch to fine delay means 9'. Accordingly, the present invention is to be limited by the scope of the following claims.

The following results are realized by this invention:

1. When input signals are continuously received at close periods, there are no glitches and an accurate timing edge can be obtained.

2. When used as a conversion clock source for digital-analog converters and analog-digital converters, there are no fluctuations in timing and periodic errors are not included in the measurement results.

3. When compared to conventional circuits with the same performance, this invention greatly reduces an overall cost.

What is claimed is:

1. A timing adjustment circuit for receiving an input signal p0 and comprising:

delay means including n serially connected delay elements, wherein n is an integer equal to or greater than two, and outputting n+1 signals to be selected, a first one of said n+1 signals to be selected being said input signal p0 which is, in turn, delayed in sequence by each serially connected delay element to generate the rest of said signals to be selected p1, . . . , pn;

a selection signal generation circuit for generating n+1 selection signals s0, . . . , sn, before said input signal p0 is input to said delay means;

a delay signal holding circuit;

a selection gate circuit connected to said delay means and further connected, via said delay signal holding circuit, to said selection signal generation circuit and comprising n+1 selection gates, wherein pairs of said signals to be selected and said selection signals, p0 and s0, p1 and s1, . . . , pn and sn, are applied as inputs to respective selection gates and one of said signals to be selected p0, . . . , pn from a selected selection gate is output;

said delay signal holding circuit comprising n+1 delay signal holding elements further connected to said delay means and responsive to said signals to be selected p0, p1, . . . , pn for holding active states of said selection signals s0, . . . , sn from said selection signal generation circuit as output states to said n+1 selection gates until initial input states of said signals to be selected p0, p1, . . . , pn become inactive.

2. The timing adjustment circuit as recited in claim 1 wherein said delay signal holding circuit holds at least some of said selection signals s0, . . . , sn from said selection signal generation circuit until active edges associated with said signals to be selected p0, . . . , pn reach said selection gates.

3. The timing adjustment circuit as recited in claim 1 wherein said selection signal generation circuit comprises a decoder for decoding a series of input data bits.

4. The timing adjustment circuit as recited in claim 1 wherein said delay signal holding circuit comprises a latch which cancels its memory state when an applied signal to be selected becomes inactive.

5. The timing adjustment circuit as recited in claim 1 wherein said delay means further comprises fine delay means for which performing a fine delay of an input signal thereto, said fine delay being equal to or less than a delay time of each said delay elements, said fine delay means connected as an input to said serially connected delay elements.

6. A timing edge generation circuit comprising:

memory means for storing counter delay data and vernier delay data;

counter means receiving said counter delay data from said memory means for delaying and outputting a period clock by counting a master clock up to said counter delay data, said period clock being obtained by dividing a master clock by a predetermined number;

a vernier indication circuit for temporarily storing and then outputting said vernier delay data received from said memory means;

said timing edge generation circuit further comprising a timing adjustment circuit for delaying and then outputting an output of said counter means in accordance with an output of vernier indication circuit, said timing adjustment circuit receiving an input signal p0 and comprising:

delay means including n serially connected delay elements, wherein n is an integer equal to or greater than two, and outputting n+1 signals to be selected, a first one of said n+1 signals to be selected being said input signal p0 which is, in turn, delayed in sequence by each serially connected delay element to generate the rest of said signals to be selected p1, . . . , pn;

a selection signal generation circuit for generating n+1 selection signals s0, . . . , sn, before said input signal p0 is input to said delay means;

a delay signal holding circuit;

a selection gate circuit connected to said delay means and further connected, via said delay signal holding circuit, to said selection signal generation circuit and comprising n+1 selection gates, wherein pairs of said signals to be selected and said selection signals, p0 and s0, p1 and s1, . . . , pn and sn, are applied as inputs to respective selection gates and one of said signals to be selected p0, . . . , pn from a selected selection gate is output;

said delay signal holding circuit comprising n+1 delay signal holding elements further connected to said delay means and responsive to said signals to be selected p0, p1, . . . , pn for holding active states of said selection signals s0, . . . , sn from said selection signal generation circuit as output states to said n+1 selection gates until initial input states of said signals to be selected p0, p1, . . . , pn become inactive.

* * * * *